United States Patent
Chang et al.

(10) Patent No.: US 12,347,692 B2
(45) Date of Patent: Jul. 1, 2025

(54) WET BENCH PROCESS WITH IN-SITU PRE-TREATMENT OPERATION

(71) Applicant: TAIWAN SEMICONDUCTOR MANUFACTURING COMPANY, LTD., Hsinchu (TW)

(72) Inventors: Chung-Wei Chang, Hsinchu (TW); Bo-Wei Chou, Hsinchu (TW); Chin-Ming Lin, Hsinchu (TW); Ping-Jung Huang, Douliou (TW); Pi-Chun Yu, Taipei (TW); Bi-Ming Yen, HsinChu (TW); Peng Shen, Taoyuan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 457 days.

(21) Appl. No.: 17/743,351

(22) Filed: May 12, 2022

(65) Prior Publication Data
US 2023/0369056 A1   Nov. 16, 2023

(51) Int. Cl.
- *H01L 21/306* (2006.01)
- *H01L 21/02* (2006.01)
- *H01L 21/67* (2006.01)

(52) U.S. Cl.
CPC .. *H01L 21/30604* (2013.01); *H01L 21/02057* (2013.01); *H01L 21/67086* (2013.01)

(58) Field of Classification Search
None
See application file for complete search history.

(56) References Cited

U.S. PATENT DOCUMENTS

| | | | | |
|---|---|---|---|---|
| 5,656,097 | A * | 8/1997 | Olesen | H01L 21/67051 134/28 |
| 5,950,645 | A * | 9/1999 | Olesen | C11D 7/06 257/E21.228 |
| 6,656,289 | B2 * | 12/2003 | Yates | H01L 21/67028 134/28 |
| 10,864,557 | B2 | 12/2020 | Tien et al. | |
| 10,923,368 | B2 * | 2/2021 | Inada | H01L 21/67086 |
| 2002/0162578 | A1 * | 11/2002 | Ma | G03F 7/425 257/E21.228 |
| 2004/0127044 | A1 * | 7/2004 | Verhaverbeke | H01L 21/02052 257/E21.228 |
| 2004/0222191 | A1 * | 11/2004 | Kim | H01L 21/67028 257/E21.251 |
| 2006/0042756 | A1 * | 3/2006 | Miyazaki | B08B 3/08 216/93 |

(Continued)

*Primary Examiner* — Allan W. Olsen
(74) *Attorney, Agent, or Firm* — NZ CARR LAW OFFICE

(57) ABSTRACT

Embodiments of the present disclosure relates to a wet bench processing including an in-situ pre-treatment prior to performing the first set of wet bench operations. The pre-treatment may include a pre-clean operation and/or a pre-heat operation. The pre-treatment may be performed in one of the existing ONB tanks without requiring adding new tanks to an existing wet bench tool. The pre-clean operation removes particles from a batch of wafers to avoid or reduce cross-contamination and defect issues, thus improving the yield rate of the wet bench process. The pre-heat operation provides better control and stabilize the temperature in the CHB tank to stabilize the process, such as to stabilize an etch rate.

19 Claims, 16 Drawing Sheets

(56) References Cited

U.S. PATENT DOCUMENTS

| | | | |
|---|---|---|---|
| 2008/0268617 A1* | 10/2008 | Thakur | H01L 21/76254 438/455 |
| 2010/0112728 A1* | 5/2010 | Korzenski | H01L 21/02079 257/E21.294 |
| 2012/0181181 A1* | 7/2012 | Cheng | G11B 5/1278 205/122 |
| 2012/0260950 A1* | 10/2012 | Tenaglia | H01L 21/67051 134/25.1 |
| 2013/0302995 A1* | 11/2013 | Fucsko | H01L 21/31111 438/745 |
| 2014/0256151 A1* | 9/2014 | Chen | H01L 29/6659 438/750 |
| 2020/0152489 A1* | 5/2020 | Inada | H01L 21/67086 |
| 2023/0230843 A1* | 7/2023 | Kim | H01L 29/66666 438/268 |

* cited by examiner

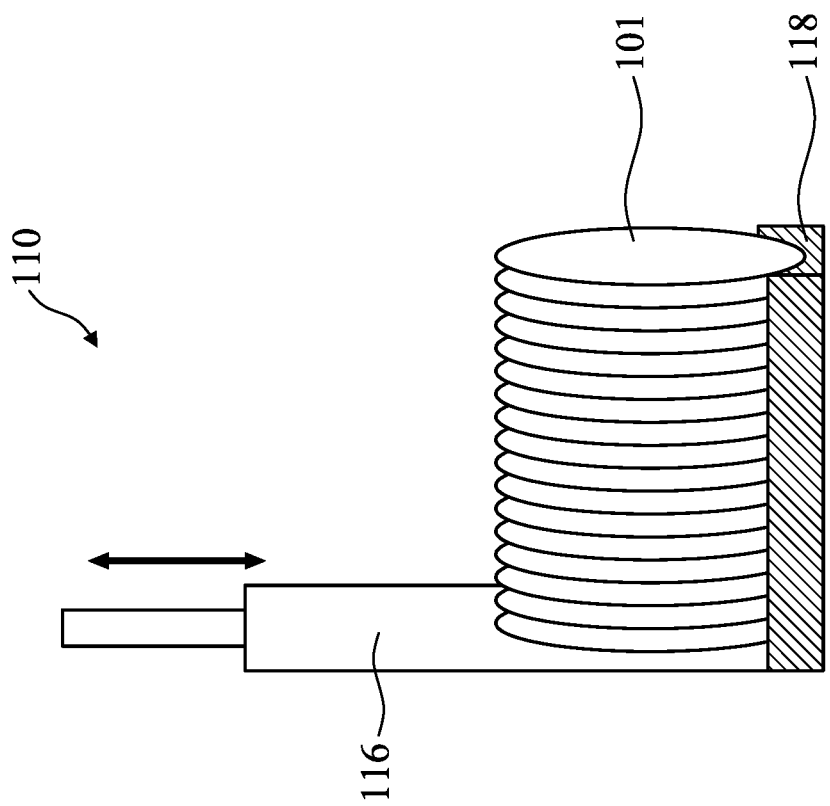

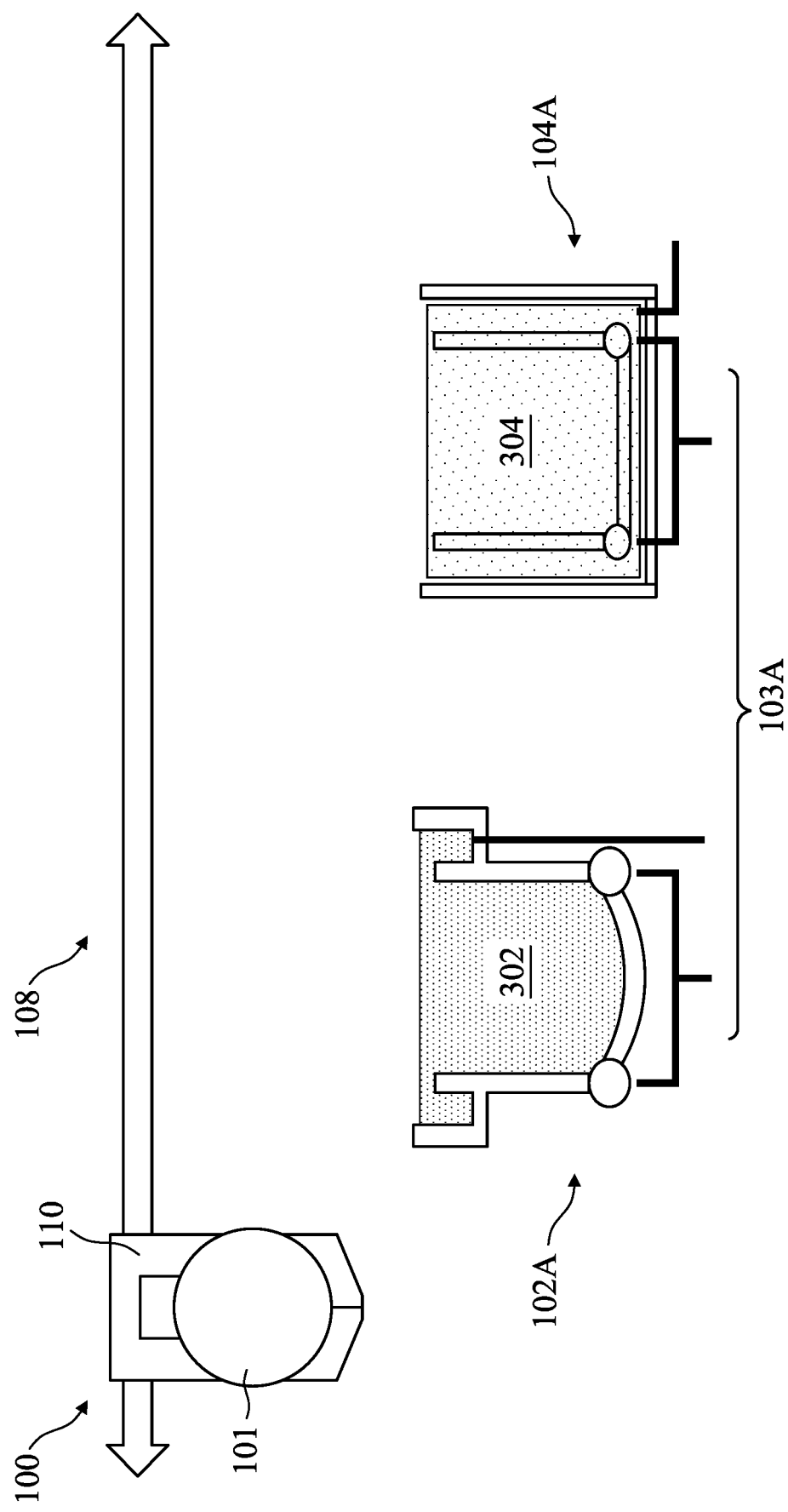

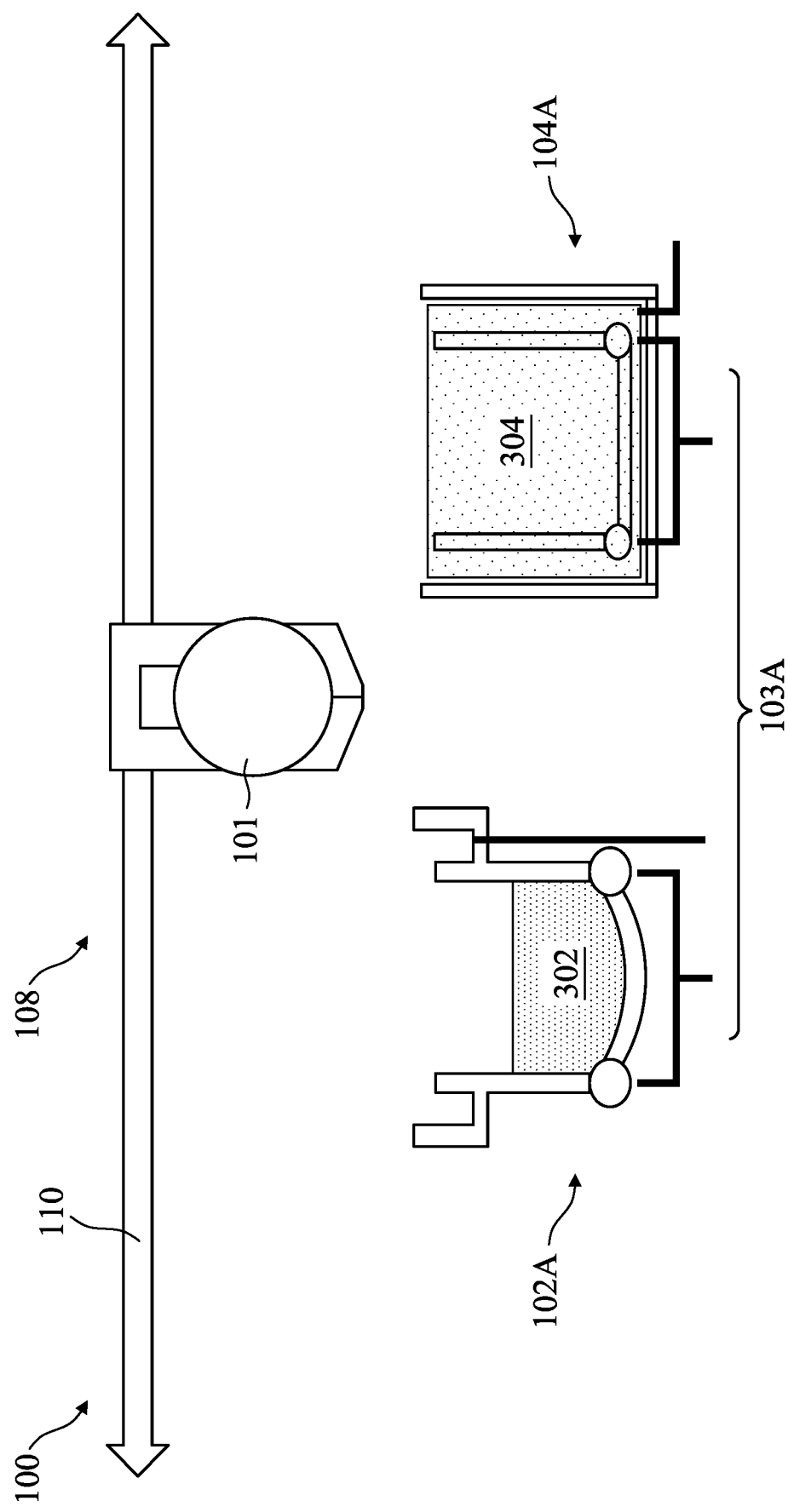

WET BENCH PROCESS WITH IN-SITU PRE-TREATMENT OPERATION

BACKGROUND

During semiconductor processing, etching is used to selectively remove one or more material from a silicon substrate or from thin films on the substrate surface. Etching may be performed through two methods. One method is dry etching using gaseous etchant, while another method is wet etching using liquid etchant solutions. Examples of dry etching may include plasma etching, ion beam etching and reactive ion etching. Examples of wet etching may include immersion etching and spray etching.

A common device for wet chemical etching of semiconductor wafers is an immersion chemical etching device, also called a wet bench tool, which includes a plurality of chemical tanks, cleaning tanks, robots, and driers. Batches of wafers are moved in sequence through the tanks, typically by operation of a computer-controlled automated apparatus.

Because a batch of wafers are processed simultaneously in a tank during wet bench process, cross contamination may occur causing defects. Therefore, there is a need to reduce cross contaminations and improve yield rate during wet bench process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1B is a schematic view of a batch of wafers disposed in a carrier to be processed in the wet bench tool of FIG. 1A.

FIGS. 3A-3G are partial view of a wet bench tool during various stages of processing a batch of wafers according to the method of FIG. 2.

DETAILED DESCRIPTION

Figure 1A:
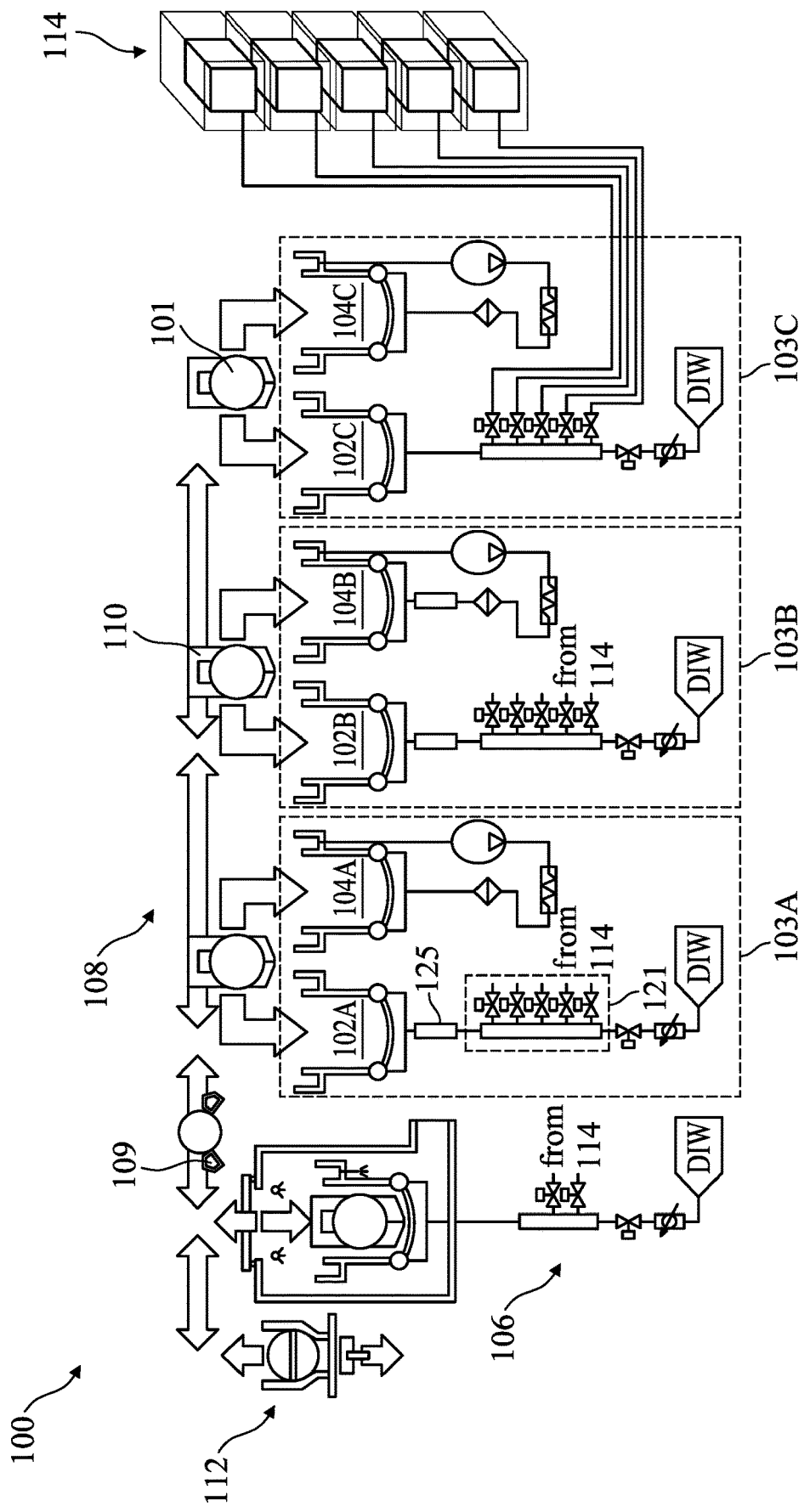
FIG. 1A is a schematic block diagram of a wet bench tool in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A is a schematic block diagram of a wet bench tool 100 in accordance with some embodiments of the present disclosure. The wet bench tool 100 may include one or more ONB (once through bath) tanks 102 and one or more CHB (concentrated heated bath) tanks 104. In some embodiments, the ONB tanks 102 and the CHB tanks 104 may be arranged in pairs and each pair as a tank set 103. As shown in FIG. 1A, three tank sets 103A, 103B, 103C are shown. The tank set 103A includes the ONB tank 102A and the CHB tank 104A. The tank set 103B includes the ONB tank 102B and the CHB tank 104B. The tank set 103C includes the ONB tank 102C and the CHB tank 104C. Any numbers of tank sets may be included in the wet bench tool 100 as desired for various applications and operations. The CHB tank 104 in each tank set may be configured to retain a process solution. During operation, a batch of wafers 101 are immersed in the process solution. The process solution used to achieve a target wet process, such as wet etching. The process solution in the CHB tank 104 may be circulated and used by many batches of wafers 101. The ONB tank 102 in each tank set 103A, 103B, 103C is configured to retain a diluted process solution, a rinse solution, and/or deionized water. One or more chemical source 114 may be connected to the ONB tank 102 to selectively provide one or more processing solutions to the ONB tank 102. After being processed in the CHB tank 104, a batch of wafers 101 are then dipped into the ONB tank 102 in the corresponding to be rinsed off and/or cleaned. The ONB tank 102 provides a fresh solution for each batch of wafers 101.

In some embodiments, the wet bench tool 100 may also include a dryer 106. The dryer 106 may be configured to dry the wafers after processing in the CHB tanks 104 and the ONB tanks 102 by spinning or using isopropyl alcohol (IPA). In some embodiments, the dryer 106 is a low pressure dryer, such as a dryer operates by the Marangoni drying effect using IPA (isopropyl alcohol).

The wet bench tool 100 may include a loading station 112 and a wafer transfer robot 109. At the loading station 112, wafers to be processed may be loaded from cassettes to one or more batch wafer carriers 110 using the wafer transfer robot 109. A batch of wafers 101 may enter the wet bench tool 100 in a batch wafer carrier 110, which may slide along a lifter slide 108 positioned over the ONB tanks 102, the CHB tanks 104, and the dryer 106. The batch wafer carriers 110 may slide along the lifter slide 108 to move batches of wafers 101 among the ONB tanks 102, the CHB tanks 104, and the dryer 106. The batch wafer carriers 110 may be lowered into any one of the ONB tanks 102, the CHB tanks 104, and the dryer 106 to process the wafers in batches therein. After processing, the batch wafer carriers 110 may be lifted from the corresponding one of the ONB tanks 102, the CHB tanks 104, and the dryer 106 and moved to the subsequent location. When process is complete, the wafer transfer robot 109 may unload the batch of wafers from the batch wafer carriers 110 to cassettes.

FIG. 1B is a schematic view of a batch of wafers disposed in the batch wafer carrier 110 according to some embodiments. As shown in FIG. 1B, the batch wafer carrier 110 may include a frame 118 to support a batch of wafers in a parallel manner with gaps between neighboring wafers such that surfaces of each wafer in the batch wafer carrier 110. The batch wafer carrier 110 may include an actuator 116 configured to slide along the lifter slide 108 and/or move vertically in and out tank set 103.

Figure 1C:
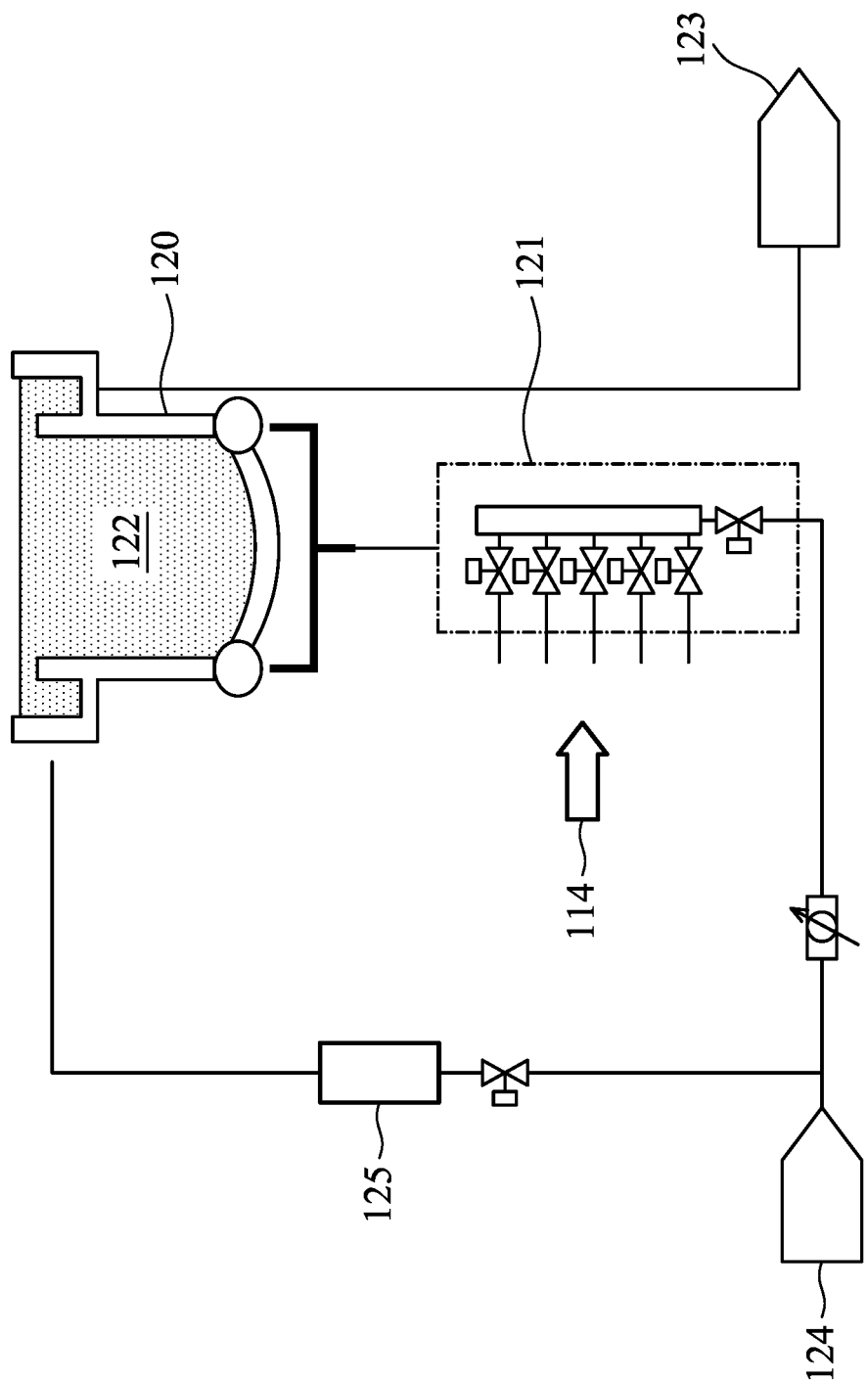
FIG. 1C is a schematic view of a once through bath tank in the wet bench tool of FIG. 1A.

FIG. 1C is a schematic view of the ONB tank 102 in the wet bench tool 100 according to embodiments of the present disclosure. The ONB tank 102 includes a housing 120 defining a processing chamber 122 therein. The housing 120 may have an upper opening to allow passage of wafers being processed. The ONB tank 102 may include a chemical manifold 121 configured to selective supply one or more processing chemicals to the processing chamber 122. The chemical manifold 121 may be connected to chemical source 114 and a deionized water source 124 to generate processing solutions including various chemicals at various concentration. In some embodiments, the processing chamber 122 may be directly connected to the deionized water source 124. Processing solutions and deionized water may be supplied to the processing chamber 122 continuously through spraying jets or any suitable inlets. The processing chamber 122 is also connected to a drain 123 so that the processing solution may be drained after each batch of wafers are processed. In some embodiments, the ONB tank 102 further includes a heater 125. In some embodiments, the heater 125 may be connected to the deionized water source 124 to supply a flow of heated deionized water to the processing chamber 122, as shown in FIG. 1C. In other embodiments, the heater 125 may be disposed between the manifold 121 and the processing chamber 122 to heat any solution supplied to the ONB tank 102, as shown in FIG. 1A. A batch of wafers disposed in the ONB tank 102, for example positioned on a batch wafer carrier, may be rinsed by processing solution or deionized water sprayed from one or more jets, or immersed in a processing solution in the processing chamber 122.

In some embodiments, the heater 125 and the manifold 121 may be retrofitted to an existing wet bench tool. In some embodiments, the heater 125 and manifold 121 may be included in every ONB tank 102 in the wet bench tool 100 so that a pre-treatment according to present disclosure may be performed with maximum flexibility. In other embodiments, the heater 125 and the manifold 121 may be included in selected ONB tank 102 to reduce cost of the tool and operation. In some embodiments, both the heater 125 and the manifold 121 are included in the ONB tank 102 so that the ONB tank 102 may perform various pre-treatment according to the present disclosure. In other embodiments, only one of the heater 125 and the manifold 121 is included in the ONB tank 102 to allow the ONB tank 102 to one of the pre-clean or pre-heat operation according to the present disclosure.

Figure 1D:
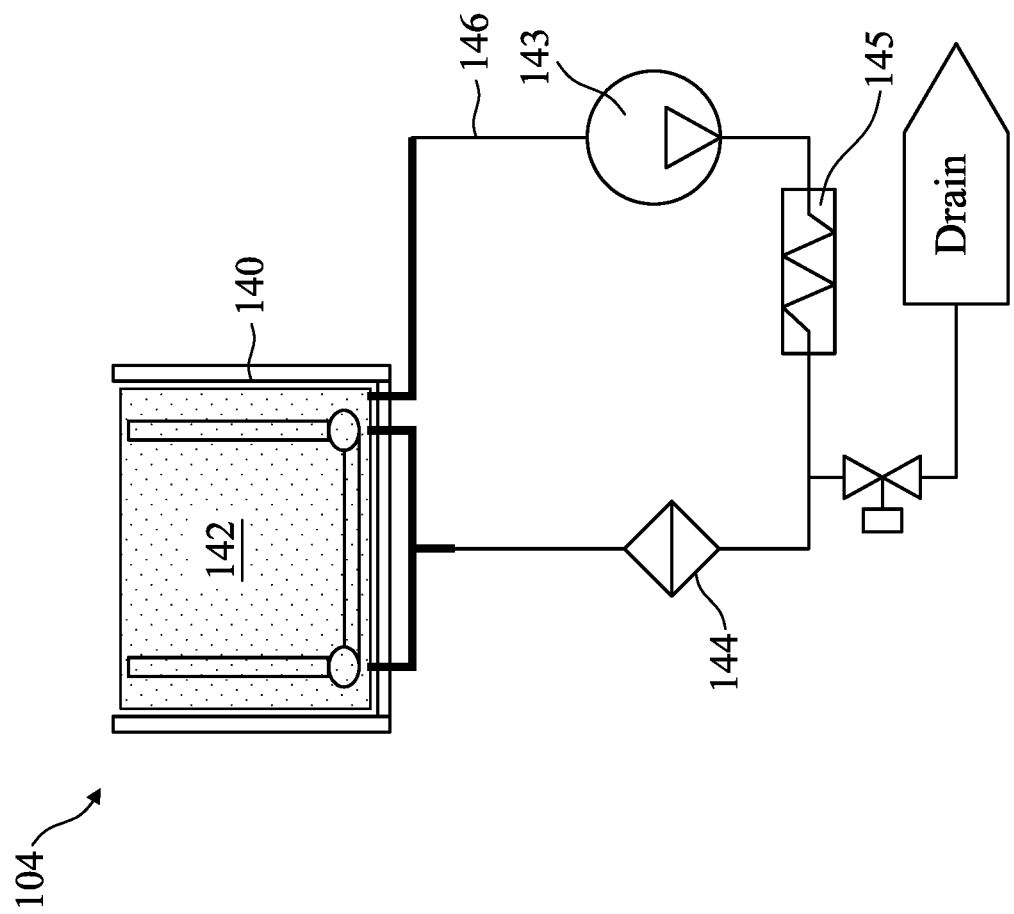
FIG. 1D is a schematic view of a concentrated heated bath tank in the wet bench tool of FIG. 1A.

FIG. 1D is a schematic view of the CHB tank 104 in the wet bench tool 100 according to the present disclosure. The CHB tank 104 includes a housing 140 defining a processing chamber 142. The CHB tank 104 is configured to retain a processing solution within the processing chamber 142, in which a batch of wafers may be immersed for a desired processing, such as etching, and cleaning. The CHB tank 104 may include a pump 143 positioned in a circulate conduit 146 to circulate the processing solution in the processing chamber 142. The CHB tank 104 may include a filter 144 positioned to heat the processing solution flowing through the circulate conduit 146. A heater 145 may be disposed in the circulate conduit 146 to remove impurities from the processing solution.

Figure 2:
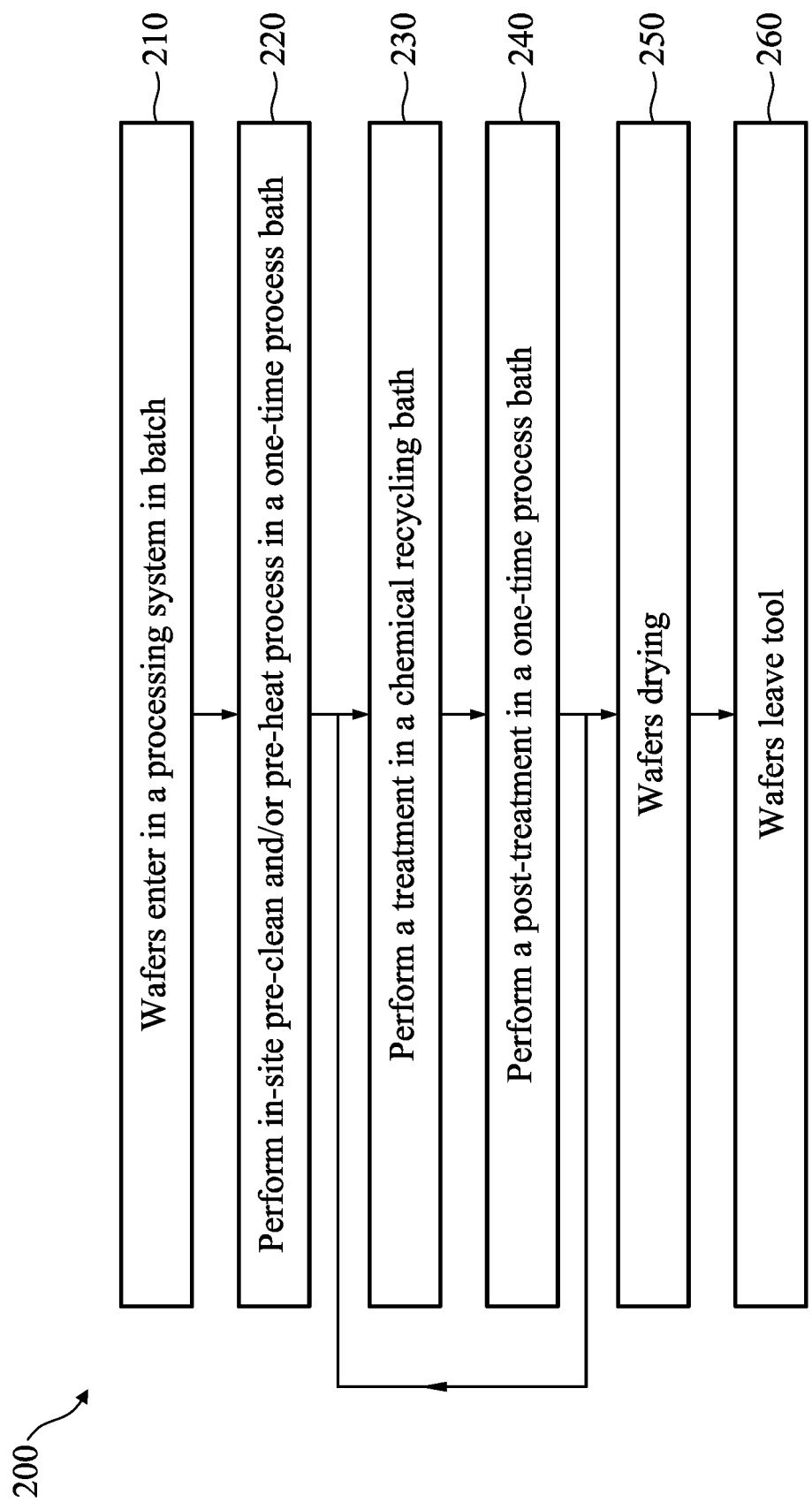
FIG. 2 is a flow chart of a method for processing a batch of wafers according to embodiments of the present disclosure.

FIG. 2 is a flow chart of a method 200 for processing a batch of wafers with one or more liquid chemical solutions according to embodiments of the present disclosure. The method 200 may be used to perform a wet bench process, such as a wet etching process, a wet cleaning process, or the like. The method 200 may be performed using a wet bench tool, such as the wet bench tool 100, described above. FIGS. 3A-3G are partial view of a wet bench tool during various stages of processing a batch of wafers according to the method 200.

A wet bench process usually includes one or more sets of wet bench operations, which are sequentially performed. Each set of wet bench operation is in a tank set, such as the tank sets 103A/103B/103C described above. Each set of wet bench operations includes two steps using a tank set. In the first operation, a batch of wafers to be processed are first immersed into a heated, high concentration processing solution, such as an acid bath, in the CHB tank of a tank set. In the second operation, the batch of wafers are rinsed with a diluted processing solution at a lower temperature in the ONB tank of the tank set.

Because the processing solution in CHB tanks moves as a circulating flow in a non-draining mode tank, wafers processed in CHB tanks are susceptible to cross-contamination. For example, organic or particulate contaminations accumulate on front side, back side or bevel of the wafers may be dislodged during immersion and travel to other wafers in the same batch or other wafers in the subsequent batches, resulting in cross-contamination causing defects on the processed wafers. The cross-contamination becomes more severe as batch size increases.

In method 200, an in-situ pre-treatment is performed prior to performing the first set of wet bench operations. In other words, when a batch of wafers enter the wet bench tool to be processed with one or more sets of two-step wet bench operations, instead of immersing the batch of wafers in the first CHB tank, an in-situ pre-treatment is first performed in one of the ONB tanks prior to being transferred to and processed in the first CHB tank. The pre-treatment may include one or more operations, such as a pre-cleaning operation, a pre-heating operation. In some embodiments, the pre-treatment may be performed in one of the existing ONB tanks without requiring adding new tanks to an existing wet bench tool. The pre-treatment removes particles from a batch of wafers to avoid or reduce cross-contamination and defect issues, thus improving the yield rate of the wet bench process. The pre-treatment also may also provide better control and stabilize the temperature in the CHB tank to stabilize the process, such as to stabilize an etch rate.

In operation 210, a batch of wafers 101 are loaded to a wet bench tool, such as the wet bench tool 100. As shown in FIG. 3A, a batch of wafers 101 are loaded into a batch wafer carrier 110. The batch wafer carrier 110 may move along the lifter slide 108 towards the tank set 103A. At this stage, the batch of wafers 101 are at room temperature.

Figure 3B:
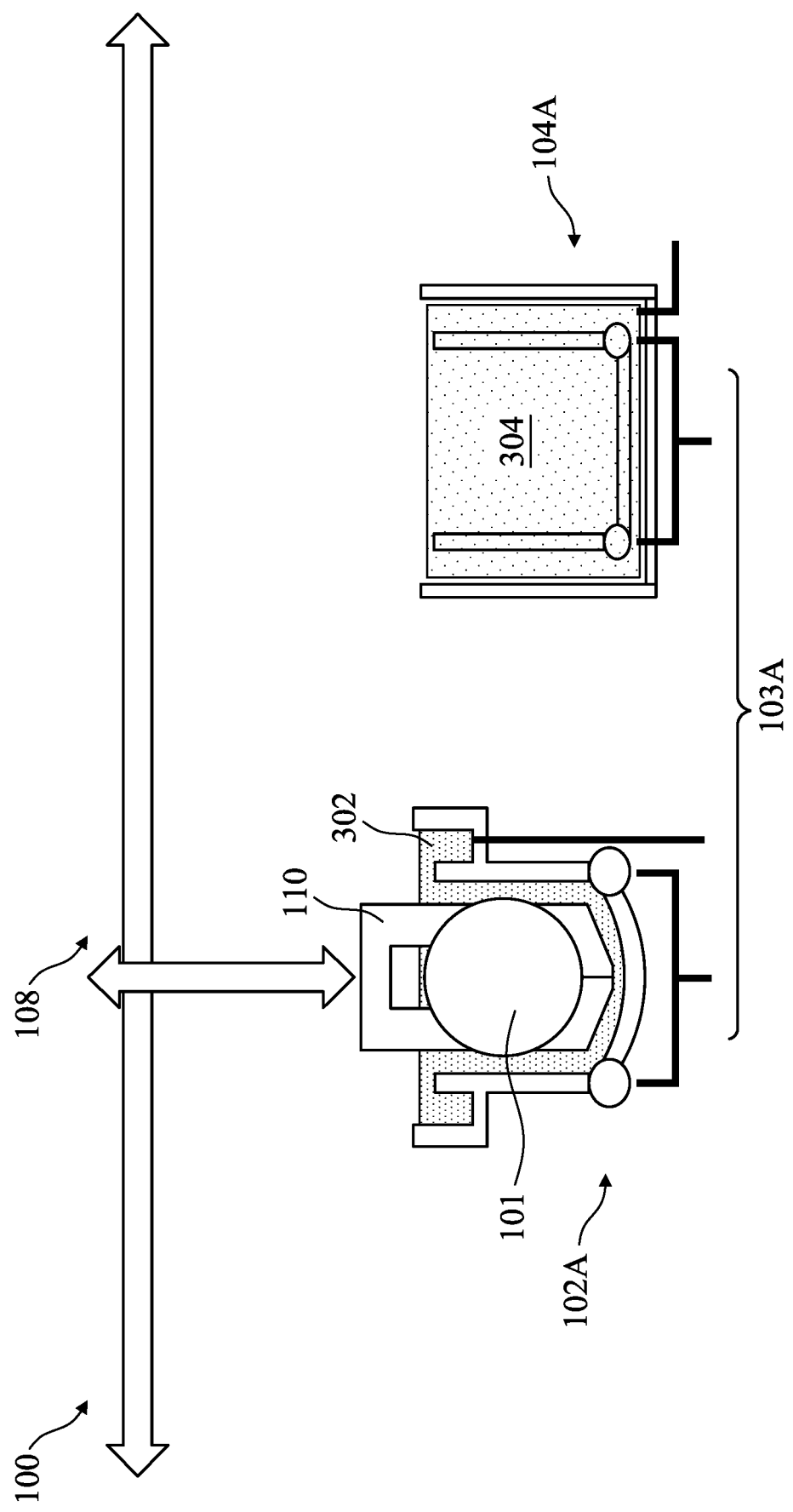

In operation 220, the batch of wafers 101 are pre-treated after entering the wet bench tool 100. The pre-treatment is performed prior to any wet bench processes. The pre-treatment is an in-site treatment as it is performed within the wet bench tool 100 and immediately before a wet bend process. The pre-treatment may be performed in one of the ONB tank 102 in the wet bench tool 100. In some embodiments, the pre-treatment is performed in an ONB tank 102 of the tank set 103 where the first wet-bench operation is to be performed. As shown in FIG. 3B, the pre-treatment is performed in the ONB tank 102A of the tank set 103A. The CHB tank 104A of the tank set 103A is prepared to perform the first wet bench process. However, the pre-treatment may be performed in any ONB tank 102A, 102B, 102C in the wet bench tool 100 that is idle from the wet bench operation set. As shown in FIG. 3A, the batch of wafers 101 are lowered in the ONB tank 102A wherein the pre-treatment is performed, while the CHB tank 104A retains a processing solution 304 configured to perform the first operation of a wet bench operation set.

In some embodiments, the in-situ pre-treatment may be performed in a designated ONB tank 102 for every batch of incoming wafers. In other embodiments, the in-situ pre-treatment may be performed different ONB tanks for different batches of incoming wafers. For example, the in-situ pre-treatment may be performed in an ONB tank having suitable length of idle time from regular wet-bench processing at the time.

The pre-treatment may include any suitable operations to remove organic contaminations and/or particles from the wafers, or to heat the wafers, or a combination thereof. Depending on the structure and/or materials on the wafers to be processed, the pre-treatment may include a pre-clean process, a pre-heat process, or a combination of pre-clean and pre-heat.

In some embodiments, the pre-treatment in operation 220 includes an in-situ pre-clean operation. An in-situ pre-clean operation may be performed during pre-treatment in operation 220 when the accuracy of the etching rate is not high, for example, when structure on the wafers has an etch stop layer. The in-situ pre-clean operation removes organic contamination and/or particles to avoid or reduce cross contamination in the subsequent CHB tank.

The in-situ pre-cleaning operation may be performed by washing or rinsing the wafers with a cleaning solution at about room temperature. In some embodiments, the cleaning solution may be a low concentration IPA, SC1 (standard cleaning solution), or other chemicals to remove organic contamination or particle type defect source from the wafers. In some embodiments, the cleaning solution may include the same chemical as the processing solution used for the subsequent wet bench process at a lower concentration. For example, the cleaning solution may be a diluted solution of a processing solution 306 (discussed in operation 230). In other embodiments, the cleaning solution includes different chemicals from the processing solution used in subsequent wet bench process.

In some embodiments, the cleaning solution may be IPA. In some embodiments, the cleaning solution may be 100% IPA. A cleaning solution of IPA may eliminate or reduce organic contamination. In other embodiments, the cleaning solution may be SC1, such as a solution including 50 parts of deionized water, 1 part of Ammonium hydroxide ($NH_4OH$), and 2 part of hydrogen peroxide ($H_2O_2$). SC1 is used to remove particles from substrates and as a surface preparation before going into growth furnaces. Due to the pH of the solution, particles removed from the surface are more likely to stay in solution than re-deposit back on the wafer surface. The SC1 solution may eliminate or reduce particle contamination. Other chemical solution may be used according to process. The pre-clean operation may about room temperature, such as in a temperature range between about 15° C. and about 30° C.

In some embodiments, the pre-cleaning operation includes one or more rinsing cycles. Each rinsing cycle includes a rinsing operation and quick dipping operation performed in an ONB tank. In some embodiments, each pre-clean cycle may be performed for about 11 minutes to about 15 minutes. A cycle time shorter than 11 minutes may not be long enough to efficiently rinse all areas of the wafers, and a cycle time longer than 15 minutes may cause schedule issues or increase cost without providing additional benefit.

Figure 4:
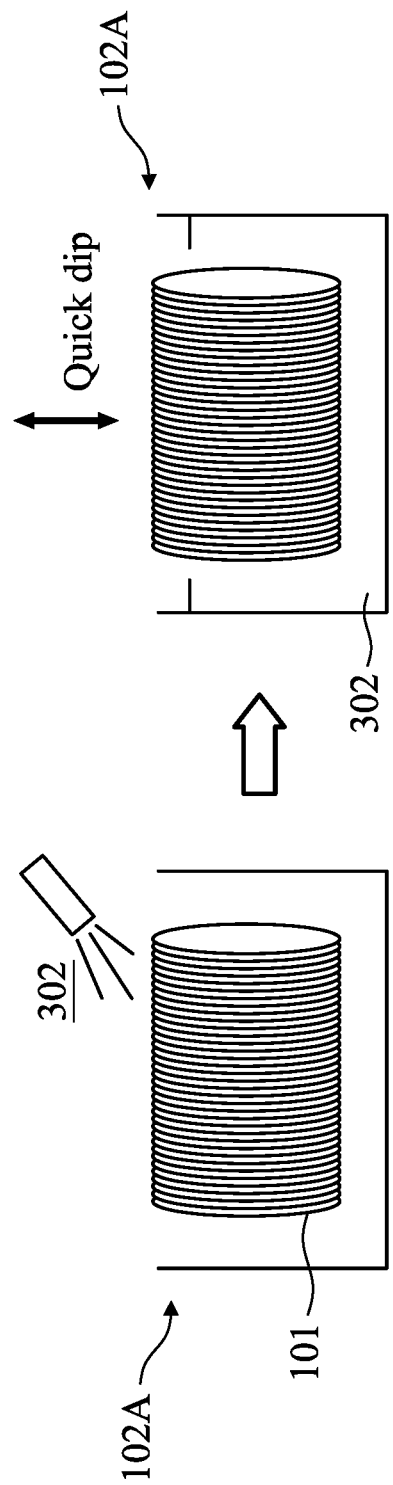
FIG. 4 schematically illustrates a pre-clean operation according to the present disclosure.

FIG. 4 schematically illustrates a rinsing cycle in the pre-clean operation according to the present disclosure. A cleaning solution 302, such as a low concentration IPA or SC1 solution discussed above, is sprayed over the batch of wafers 101 to rinse the batch of wafers 101. The batch of wafers 101 may be spinning in the ONB tank 102 during rinsing. After rinsing, the batch of wafers 101 are dipped into the cleaning solution 302 briefly to conclude a rinsing cycle. In some embodiments, after dipping, the batch of wafers 101 are transferred towards the adjacent CHB tank where the first wet bench operation set is to be performed, as described in operation 230.

In some embodiments, the rinsing cycle may be repeated prior to the operation 230. The rinsing cycle may be repeated in the same ONB tank or a different ONB tank according to scheduling of the wet bench tool 100. In some embodiments, two or more rinsing cycles may be performed using two or more different cleaning solutions. For example, a first rinsing cycle may be performed using a cleaning solution including IAP, and a second rinsing cycle may be performed using a cleaning solution including SC1.

In some embodiments, the pre-treatment in operation 220 includes an in-situ pre-heat operation. For example, an in-situ pre-heat operation is performed during pre-treatment in operation 220 when the accuracy of the etching rate is high or when the structures on the wafers may be damaged by chemicals in a cleaning solution, such as the cleaning solution used in the in-situ pre-clean operation described above. For example, when structures on the wafers do not have an etch stop layer, such as structures include exposed SiGe layers in a selective etching process. The in-site pre-heat operation reduces the temperature drop occurs during in subsequent process in the CHB tank shortening the temperature stabilization time, thus improving process uniformity.

The in-situ pre-heat operation may be performed by washing or rinsing the wafers with a high temperature deionized water to pre-heat the wafers for a period of time. In some embodiments, the wafers may be rinsed in a flow of high temperature deionized water about 5 minutes to about 9 minutes. A time period shorter than 5 minutes may not be long enough to uniformly heat all areas of the wafers, and a time period longer than 9 minutes may cause schedule issues, heat the wafers at a temperature higher than desired, or not further heat the wafers beyond the temperature of the deionized water. In some embodiments, the in-situ pre-heat operation may heat wafers to a temperature in a range between 65° C. and 95° C. A temperature lower than 65° C. may not provide enough stabilizing benefit. A temperature higher than 95° C. may not be uniformly achieved as the temperature is close to boiling point of the water. In some embodiments, the in-situ pre-heat operation may raise the wafer temperature in a range between about 45° C. and about 70° C. In some embodiments, the in-situ pre-heat operation may heat wafers to reduce a temperature gap between the wafer temperature and the solution temperature in the subsequent CHB tank by about 30% to about 60%. For example, the temperature gap between the wafers and the solution in the subsequent CHB tank is about 140° C. (e.g. the process solution in the subsequent CBH tank is about 160° C. and the wafer temperature is about 20° C.), the in-situ pre-heat may reduce the temperature gap to arrange between 98° C. and 56° C. (e.g. by heating the wafers to a temperature to in arrange between 62° C. and 94° C.).

Figure 5:
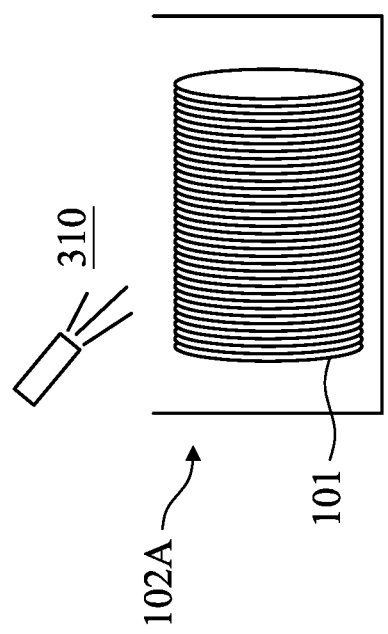
FIG. 5 schematically illustrates a pre-heat operation according to the present disclosure.

FIG. 5 schematically illustrates a pre-heat operation according to the present disclosure. A flow of heated deionized water 310 is sprayed over the batch of wafers 101 to rinse the batch of wafers 101. The batch of wafers 101 may be spinning in the ONB tank 102 during rinsing. After rinsing, the batch of wafers 101 are immediately transferred to the CHB tank configured for the subsequent processing, or the first wet-bench process, to be described in operation 230.

In some embodiments, the pre-treatment in operation 220 includes a combination of an in-situ pre-clean operation and an in-situ pre-heat operation. The combined operation may be performed during pre-treatment in operation 220 when the structures on the wafers do not have vulnerable material or structures are not easily damaged by a pre-clean and pre-heat operations, and the accuracy of etching rate is not high. In the combined operation, the pre-clean and pre-heat operations are similar to the individually performed operations described above. The combined in-situ pre-clean and pre-heat operation removes organic contamination and/or particles to avoid or reduce cross contamination in the subsequent CHB tank, and also reduces the temperature drop occurs during in subsequent process in the CHB tank shortening the temperature stabilization time, thus improving process uniformity.

Figure 6:
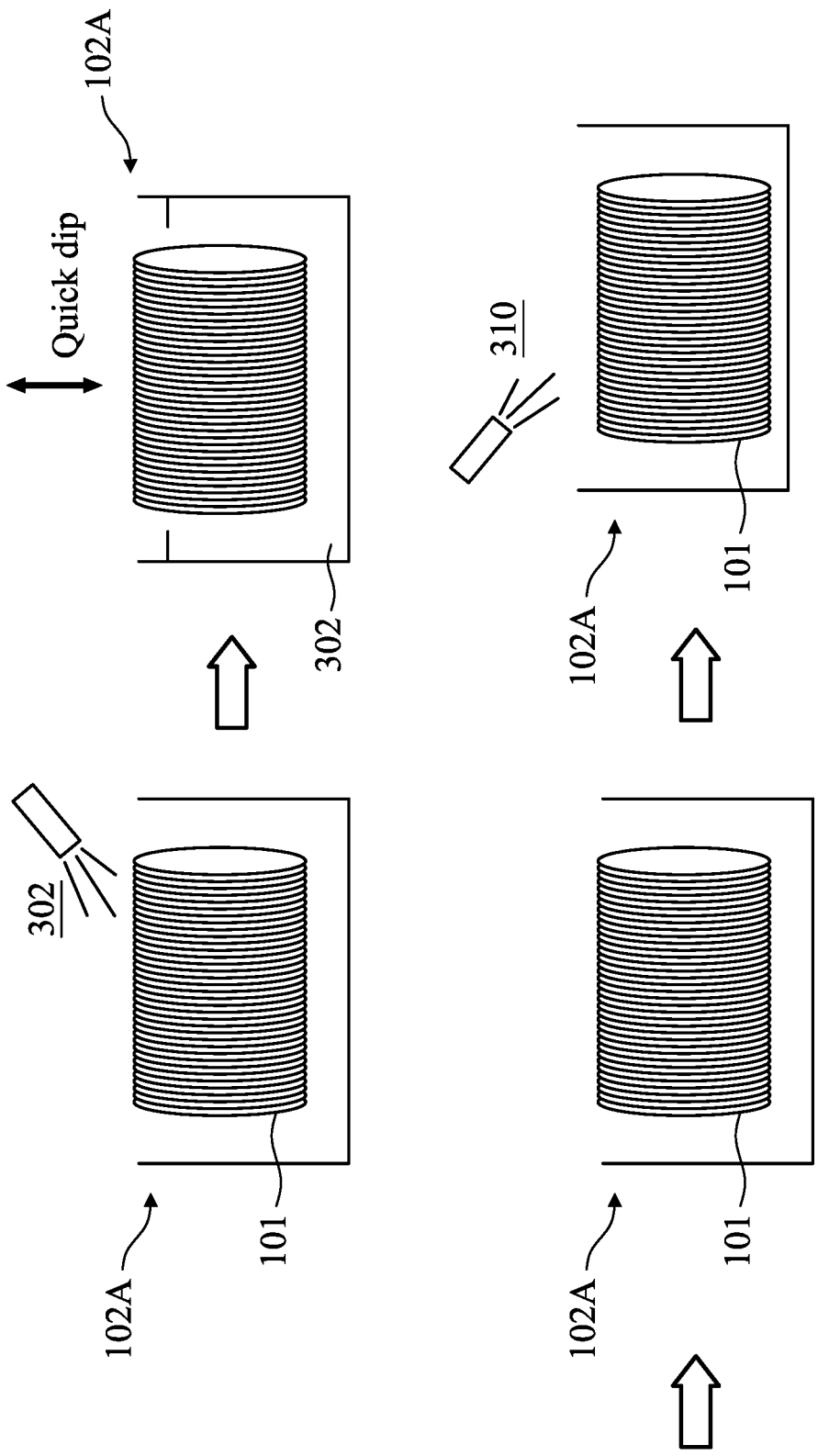
FIG. 6 schematically illustrates a combined pre-clean and pre-heat operation according to the present disclosure.

In some embodiments, the combined pre-clean and pre-heat operation may be performed in the same ONB tank. In other embodiments, the pre-clean operation may be performed in different ONB tanks. FIG. 6 schematically illustrates a combined pre-clean and pre-heat operation according to the present disclosure.

In some embodiments, the pre-cleaning operation includes one or more rinsing cycles. Each rinsing cycle includes a rinsing operation and quick dipping operation performed in an ONB tank. In some embodiments, each pre-clean cycle may be performed for about 11 minutes to about 15 minutes. A cleaning solution 302, such as a low concentration IPA or SC1 solution discussed above, is sprayed over the batch of wafers 101 to rinse the batch of wafers 101. The batch of wafers 101 may be spinning in the ONB tank 102 during rinsing. After rinsing, the batch of wafers 101 are dipped into the cleaning solution 302 briefly to conclude a rinsing cycle. In some embodiments, additional rinsing cycle may be performed using the same or different cleaning solutions.

After rinsing cycles are completed, the cleaning solution 302 is drained from the ONB than 102 to conclude the in-situ pre-clean operation. A pre-heat operation is then performed. A flow of heated deionized water 310 is then sprayed over the batch of wafers 101 to rinse and pre-heat the batch of wafers 101. The batch of wafers 101 may be spinning in the ONB tank 102 during rinsing. The in-situ pre-heat operation may be performed by washing or rinsing the wafers with a high temperature deionized water to pre-heat the wafers for a period of time. In some embodiments, the wafers may be rinsed in a flow of high temperature deionized water about 5 minutes to about 9 minutes. In some embodiments, the in-situ pre-heat operation may heat wafers to a temperature in a range between 65° C. and 95° C.

After rinsing, the batch of wafers 101 are immediately transferred to the CHB tank configured for the subsequent processing, or the first wet-bench process, to be described in operation 230.

In operations 230 and 240, a set of wet bench operation is performed. The set of wet bench operations may be performed in one tank set 103, where operation 230 is performed in the CHB tank 104 and operation 240 is performed in the ONB tank 102 of the tank set 103. The operation 230 is a high-temperature high-concentration process performed in a recirculated solution while the operation 240 is a low-temperature low-concentration rinse and wash process performed in a fresh flow of processing solution. Depending on the particular processing, one or more sets of wet bench operations may be sequentially performed in the wet bench tool 100. For example, one or more sets of wet bench operations are performed sequentially in different tank sets 103. The operations 230 and 240 may be a conventional aspect of conventional wet cleaning tools and thus be discussed herein in brevity and as examples.

As shown in FIG. 3C, after the in-situ pre-treatment in operation 220, the batch of wafers 101 are immediately lifted from the ONB tank 102 and transferred to the CHB tank 104 to be performed the first operation 230 to obtain the maximum benefit of the in-site pre-treatment. The ONB tank 102 is then drained for a subsequent operation, which may be the operation 240 or an operation 220 for a batch of wafers newly entered into the wet bench tool 100.

Figure 3D:
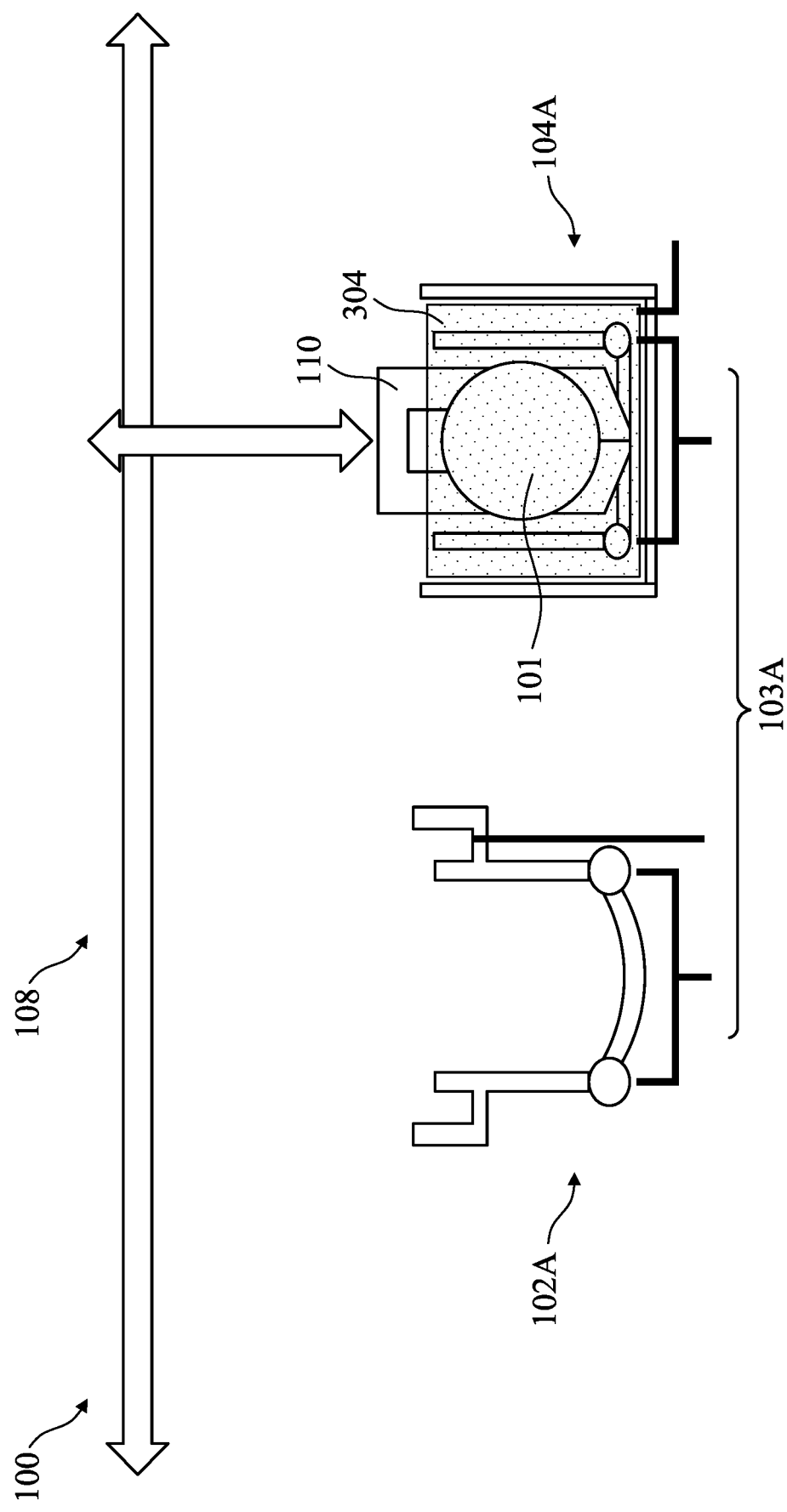

In operation 230, as shown in FIG. 3D, the batch of pre-treated wafers 101 are lowered into the CHB tank 104 and immersed into a process solution 304. The processing solution 304 may be various chemicals to achieve various wet bench applications. For example, the processing solution 304 may be phosphoric acid ($H_3PO_4$), buffered hydrofluoric acid (BHF), peroxymonosulfuric acid ($H_2SO_5$, or Caro), a high concentration hydrofluoric acid (HF), a high concentration SC1 (such as SC1 including 5 parts of deionized water, 1 part of $NH_4OH$, and 1 part of $H_2O_2$), a high concentration SC2 (such as SC1 solution including 6 parts deionized water, 1 part of HCl, and 1 part of $H_2O_2$), or other suitable wet processing agents.

In some embodiments, the processing solution 304 is hot phosphoric acid, $H_3PO_4$, may be maintained at a temperature in a range of between about 70° C. and about 160° C. Particularly, the processing solution 304 may be maintained at a temperature in a range of between about 140° C. and about 160° C. The processing solution 304 may be used to selectively etch a material layer, such as a silicon nitride containing layer, with the following reactions:

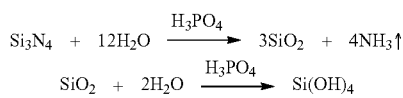

In some embodiments, a circulation process is performed via a circulate conduit (such as the circulate conduit 146 in FIG. 1D). During the circulation process, the processing solution 304 are drawn from the CHB tank 104 via the circulate conduit and back into the CHB tank 104. In some embodiments, after the circulation process, a substantially homogenous liquid processing solution 304 is provided in the CHB tank 104. In some embodiments, in the circulation process, particles in the processing solution 304 are filtered by a filter, such as the filter 144 in FIG. 1D, of the circulate conduit. In some embodiments, in the circulation process, the processing solution 304 is heated to a desired temperature for processing by a heater, such as the heater 145 in FIG. 1D, in the circulate conduit. In some embodiments, the circulation process is continuously operated except that a maintenance process is performed.

Figure 3E:
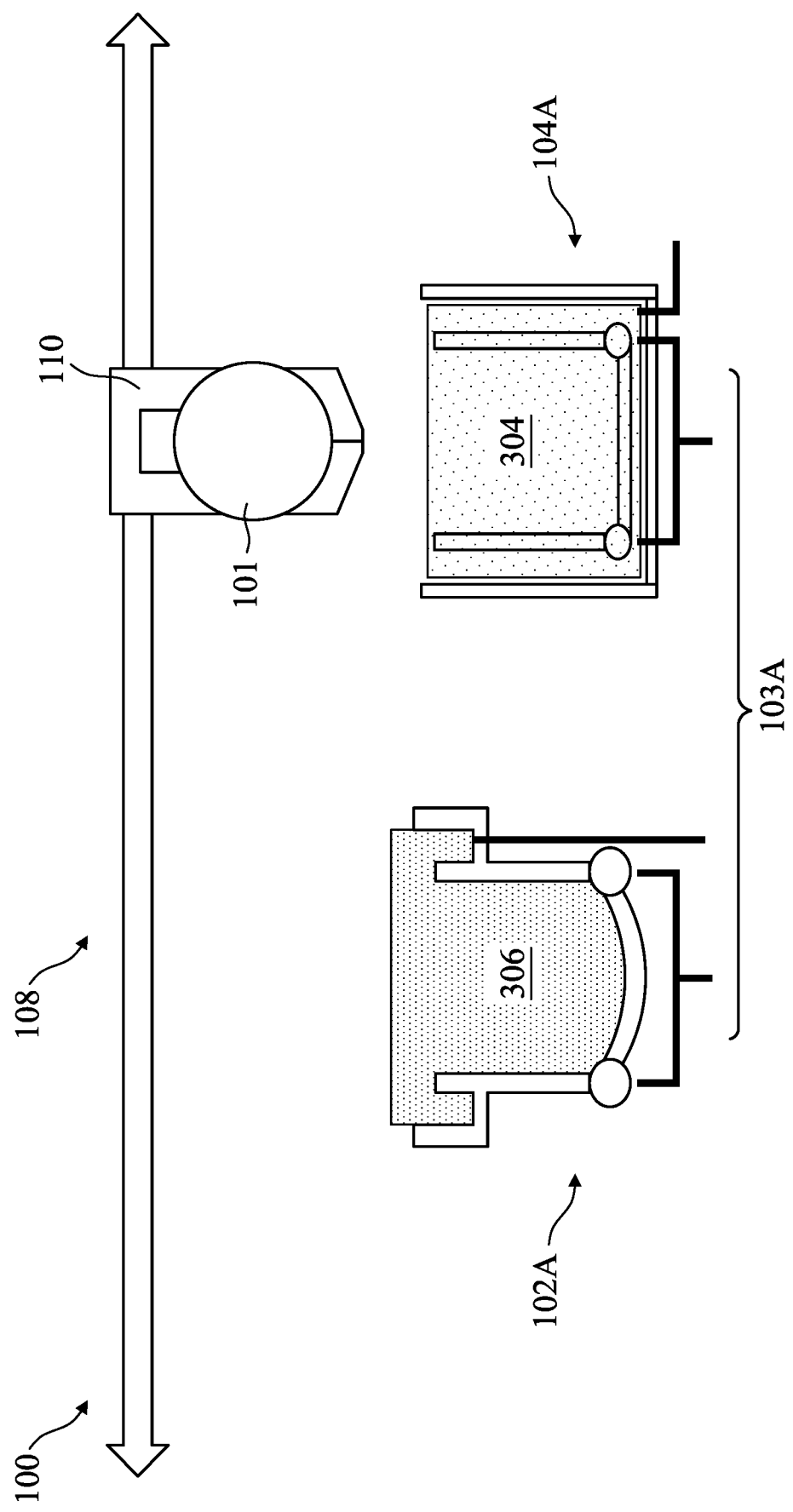

In operation 230, the wafers 101 are immersed in the processing solution 304 for a period of time to achieve desired processing results, and then lifted from the CHB tank 104 and transferred towards the ONB tank 102 wherein the second operation of the wet bench operation set is to be performed, as shown in FIG. 3E.

Figure 3F:
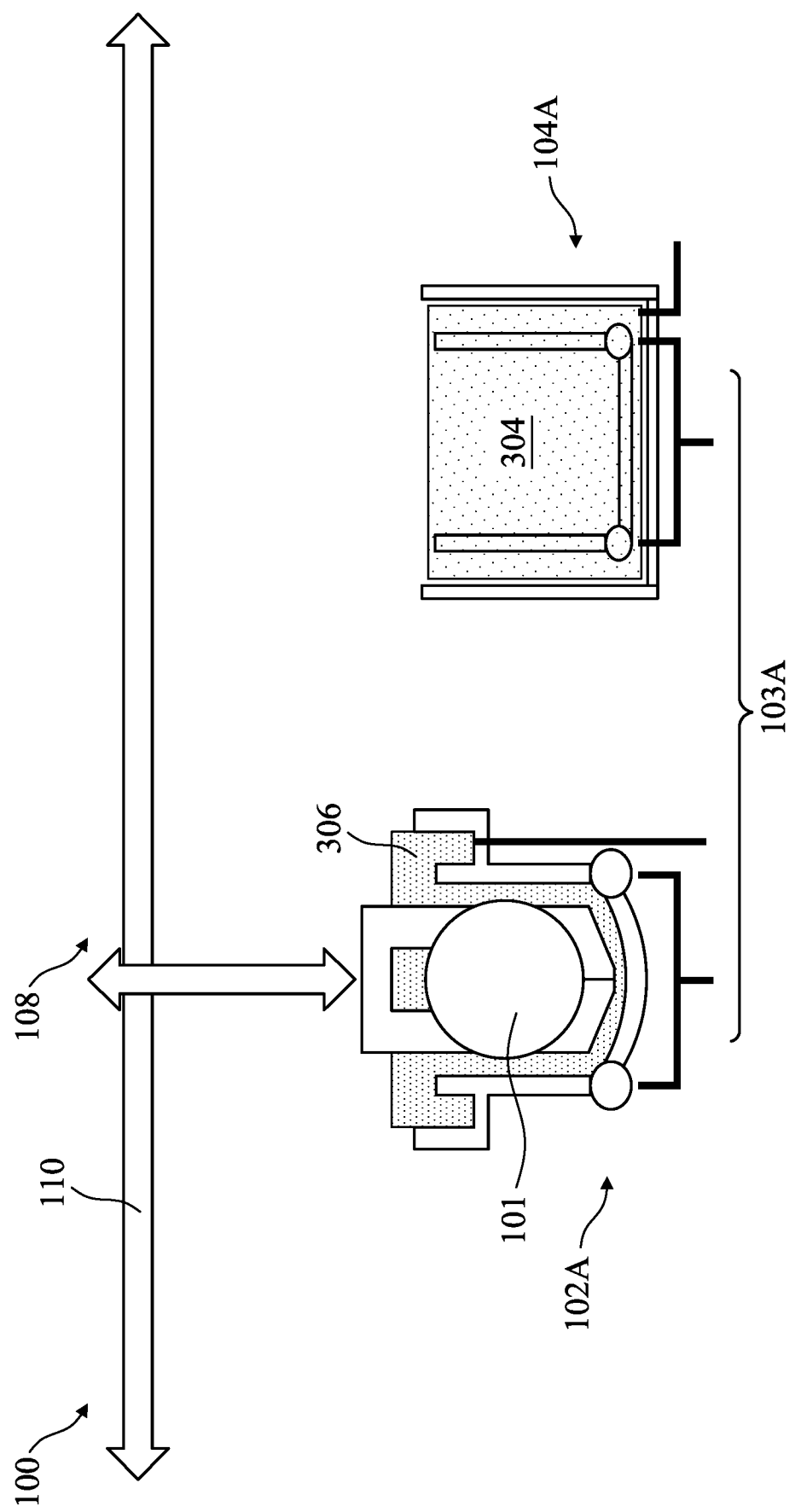
Figure 3G:
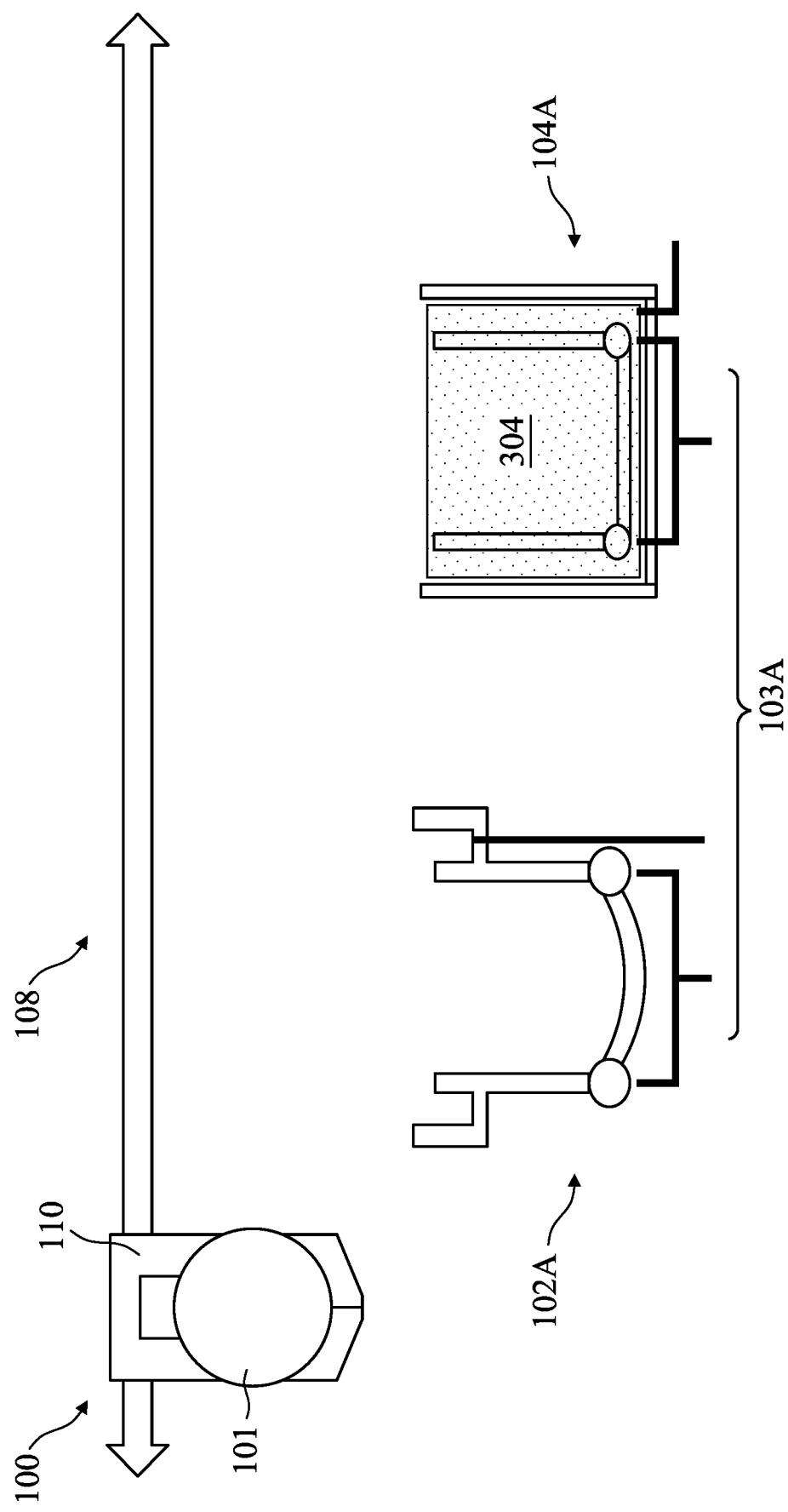

In operation 240, as shown in FIG. 3F, the wafers 101 are lowered into ONB tank 102 for the second operation of the wet bench process. In some embodiments, the wafers 101 may be immersed within a processing solution 306 in the ONB tank 102 for a quick dump rinse (QDR) or a quick etch rinse (QER) process. The processing solution 306 may be a deionized water, or a dilute solution, such as a low concentration SC1, a low concentration SC2, a diluted HF, or other suitable wet processing agents. After operation 240, the wafers are lifted from the ONB tank 102 and the processing solution 306 is drained, as shown in FIG. 3G.

The operations 230, 240 may be repeated in other tank sets 103 according to the application. When all wet bench operation sets are completed, the wafers 101 may be dried at operation 250.

At operation 250, the wafers 101 may be dried at a drying chamber, such as the dryer 106. In some embodiments, the wafers 101 may be dried by a conventional drying process.

At operation 260, the dried wafers 101 may be unloaded from the batch wafer carrier 110 to a cassette and exit the wet bench tool 100.

Even though methods according to the present disclosure are described with a wet bench tool with vertical tanks, embodiments of the present disclosure may be performed in any wet processing tools for an in-situ pre-treatment to remove organic contamination, remove particles, or pre-heat, or any other suitable treatment that is beneficial to the subsequent wet etch, wet clean, or similar processes. Even though methods of the present disclosure may improve yield in batch processing, the in-situ pre-treatment according to the present disclosure may be used prior to single wafer wet processing.

The pre-clean operation included in the in-situ pre-treatment according to the present disclosure has reduced cross contamination in batch wet processing, thus increasing yield by reducing defects, and increasing productivity by allowing the wafers to be processed in larger batches.

The pre-heat operation included in the in-situ pre-treatment according to the present disclosure has reduced temperature stabilizing time, thus improve etch selectivity. When the wafer temperatures are lower significantly lower than the processing solution, the temperature in the processing solution drops upon immersion of the wafers, which is sometimes referred to as Bench Effect. The larger the batch size, the more significant the temperature drop. Temperature drop in the processing solution not only affects etch rate but also affects etch selectivity.

Figure 7:
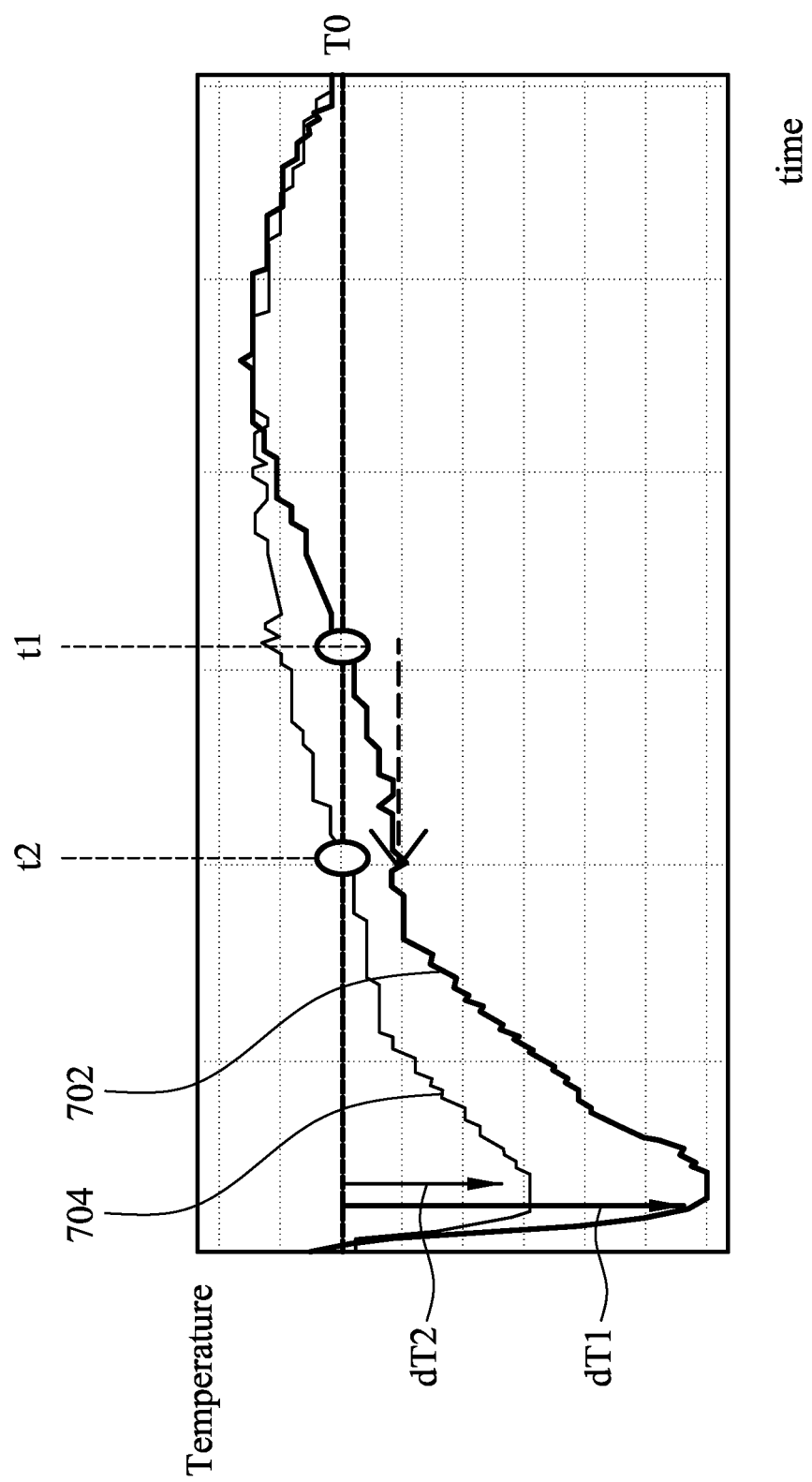
FIG. 7 is a schematic graph of temperature-time curve in a CHB tank.

FIG. 7 is a schematic graph of temperature-time curve in a CHB tank for a wet bench process. In the graph shown FIG. 7, the x-axis indicates time after a batch of wafers are immersed into a processing solution comprising hot phosphoric acid maintained at a temperature at T0 prior to the wafers are immersed. The y-axis indicates the temperature of the process solution after the wafers are immersed. Curve 702 is the temperature-time curve in a process when the wafers are not pre-heated. Curve 702 is a temperature-time curve in a process when the wafers are pre-heated according to operation 220 of the present disclosure. In curve 702, the temperature of the processing solution dipped amount of dT1. In curve 704, temperature of the processing solution dipped amount of dT2. dT2 is about 50% of dT1. In curve 702, the temperature of the processing solution returned to T0 at time t1. In curve 704, the temperature of the processing solution returned to T0 at time t2. Time t2 is about 33% shorter than time t1. Thus, the in-situ pre-heat operation has reduced the temperature drop in the CHB by about 50% and shortened the temperature stabilization period by about 33%.

Various embodiments or examples described herein offer multiple advantages over the state-of-art technology. The in-situ pre-treatment according to present disclosure removes or reduces organic contamination and particles from a batch of wafers to avoid or reduce cross-contamination and defect issues, thus improving the yield rate of the wet bench process. The pre-treatment also may also provide better control and stabilize the temperature in the CHB tank to stabilize the process, such as to stabilize an etch rate. The in-site pre-treatment may be performed in one of the existing ONB tanks without adding processing changes to an existing wet bench tool.

Some embodiments of the present provide a method comprising loading a batch of wafers into a wet bench tool comprising a CHB (concentrated heated bath) tank and a first ONB (once through bath) tank, wherein the batch of wafers are at a first temperature, upon loading the batch of wafers, pre-treating the batch of wafers in the first ONB tank with a pre-treatment solution; immersing the batch of wafers in a process solution stored in the CHB tank after pre-treating the batch of wafers in the first ONB tank, wherein the process solution is at a second temperature, and the second temperature is higher than the first temperature; and rinsing the batch of wafers in a rinse solution.

Some embodiments of the present disclosure provide a method comprising pre-heating a batch of wafers from a first temperature to a second temperature in a ONB tank of a wet bench tool, wherein the second temperature is a range between about 65° C. and about 95° C.; upon completion of pre-heating, moving the batch of wafers from the ONB tank to a CHB tank in the wet bench tool to immerse the batch of wafers in a processing solution in the CHB tank, wherein the processing solution is at a third temperature prior to immersing the batch of wafers, and the third temperature is higher than the second temperature; and moving the batch of wafers from the CHB tank to the ONB tank to rinse the batch of wafers in the ONB tank with a rinsing solution.

Some embodiments of the present disclosure provide a method, comprising loading a batch of wafers into a wet bench tool comprising a tank set, wherein the tank set comprises: a CHB tank having a processing solution, wherein the processing solution being recirculated; and a ONB tank in connection with one or more chemical supply bath and a heater; upon loading the batch of wafers, pre-treating the batch of wafers in the ONB tank with a pre-cleaning solution supplied from the one or more chemical supply bath or a heated deionized water; after pre-treating the batch of wafers, performing a wet bench operation set comprising: immersing the batch of wafers in the processing solution in the CHB tank; and rinsing the batch of wafers in the ONB tank.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A method, comprising:
    loading a batch of wafers into a wet bench tool comprising a CHB (concentrated heated bath) tank and a first ONB (once through bath) tank, wherein the batch of wafers are at a first temperature,
    upon loading the batch of wafers, pre-treating the batch of wafers in the first ONB tank with a pre-treatment solution;
    immersing the batch of wafers in a process solution stored in the CHB tank after pre-treating the batch of wafers in the first ONB tank, wherein the process solution is at a second temperature, the second temperature is higher than the first temperature, pre-treatment solution comprises a first chemical at a first concentration, the process solution comprises the first chemical at a second concentration, and the second concentration is higher than the first concentration; and
    rinsing the batch of wafers in a rinse solution,
    wherein pre-treating the batch of wafers further comprises rinsing the batch of wafers with a hot deionized water to heat the batch of wafers to a third temperature, the third temperature is higher than the first temperature and lower than the second temperature.

2. The method of claim 1, wherein rinsing the batch of wafers in the rinse solution is performed in the first ONB tank.

3. The method of claim 1, wherein pre-treating the batch of wafers comprises rinsing the batch of wafers with the pre-treatment solution in the first ONB tank.

4. The method of claim 3, wherein the pre-treatment solution includes hot deionized water to heat the batch of wafers to the third temperature.

5. The method of claim 1, wherein the wet bench tool further comprises a second ONB tank, and rinsing the batch of wafers in the rinse solution is performed in the second ONB tank.

6. The method of claim 1, wherein the rinse solution comprises the first chemical at a third concentration lower than the second concentration.

7. The method of claim 1, wherein the first chemical comprises one of phosphoric acid ($H_3PO_4$), buffered hydrofluoric acid (BHF), peroxymonosulfuric acid ($H_2SO_5$), and hydrofluoric acid (HF).

8. The method of claim 1, wherein pre-treating the batch of wafers further comprises: prior to rinsing the batch of wafers with a hot deionized water to heat the batch of wafers to a third temperature,
    dipping the batch of wafers in the pre-treatment solution in the first OBN tank; and
    draining the pre-treatment solution from the first OBN tank.

9. The method of claim 8, wherein pre-treating the batch of wafers further comprises: prior to dipping the batch wafers in the pre-treatment solution, spraying a cleaning solution over the batch of wafers.

10. The method of claim 1, wherein rinsing the batch of wafers with a hot deionized water for about 5 minutes to about 9 minutes.

11. A method comprising:
    pre-heating a batch of wafers from a first temperature to a second temperature in a ONB tank of a wet bench tool, wherein the second temperature is a range between about 65° C. and about 95° C.;
    upon completion of pre-heating, moving the batch of wafers from the ONB tank to a CHB tank in the wet bench tool to immerse the batch of wafers in a processing solution in the CHB tank, wherein the processing solution is at a third temperature prior to immersing the batch of wafers, and the third temperature is higher than the second temperature;
    moving the batch of wafers from the CHB tank to the ONB tank to rinse the batch of wafers in the ONB tank with a rinsing solution;
    prior to pre-heating the batch of wafers,
        pre-cleaning the batch of wafers in the ONB tank with a pre-cleaning solution; and
        draining the ONB tank.

12. The method of claim 11, wherein the first temperature is room temperature, and third temperature is in a range between 140° C. and 160° C.

13. The method of claim 11, wherein pre-heating the batch of wafers comprising rinsing the batch of wafers with heated deionized water.

14. The method of claim 11, wherein pre-cleaning the batch of wafers comprises:
    rinsing the batch of wafers with the pre-cleaning solution; and
    dipping the batch of wafers in the pre-cleaning solution in the ONB tank.

15. The method of claim 11, wherein the pre-cleaning solution is a diluted solution of the processing solution.

16. The method of claim 15, wherein the pre-cleaning solution is at room temperature.

17. A method, comprising:
    loading a batch of wafers into a wet bench tool comprising a tank set, wherein the tank set comprises:
        a CHB tank having a processing solution, wherein the processing solution being recirculated; and
        a ONB tank in connection with one or more chemical supply bath and a heater;
    upon loading the batch of wafers, pre-treating the batch of wafers in the ONB tank with a pre-cleaning solution supplied from the one or more chemical supply bath and a heated deionized water source, wherein pre-treating the batch of wafers comprises:
        rinsing the batch of wafers with the pre-cleaning solution; and
        dipping the batch of wafers in the pre-cleaning solution in the ONB tank,
    wherein the pre-cleaning solution is a diluted solution of the processing solution;
    after pre-treating the batch of wafers, performing a wet bench operation set comprising:
        immersing the batch of wafers in the processing solution in the CHB tank; and
        rinsing the batch of wafers in the ONB tank.

18. The method of claim 17, wherein pre-treating the batch of wafers further comprises:
   draining the pre-cleaning solution from the ONB tank; and
   rinsing the batch of wafers with heated deionized water.

19. The method of claim 17, wherein the processing solution comprises one of phosphoric acid ($H_3PO_4$), buffered hydrofluoric acid (BHF), peroxymonosulfuric acid ($H_2SO_5$), and hydrofluoric acid (HF).

* * * * *